(12) United States Patent
Jeong et al.

(10) Patent No.: US 9,299,613 B2
(45) Date of Patent: Mar. 29, 2016

(54) METHOD FOR CUTTING SUBSTRATE

(71) Applicants: Samsung Display Co., Ltd., Yongin (KR); Philoptics Co., Ltd., Suwon-si (KR)

(72) Inventors: Il Young Jeong, Suwon-si (KR); Tae Yong Kim, Asan-si (KR); Cheol Lae Roh, Asan-si (KR); Je Kil Ryu, Hwaseong-si (KR); Jeong Hun Woo, Seongnam-si (KR); Gyoo Wan Han, Yongin-si (KR); Ki Su Han, Anyang-si (KR); Tae Hyoung Cho, Suwon-si (KR); Jong Nam Moon, Suwon-si (KR)

(73) Assignees: Samsung Display Co., Ltd., Yongin-si (KR); Philoptics Co., Ltd., Suwon-si (KR)

( * ) Notice: Subject to any disclaimer, the term of this patent is extended or adjusted under 35 U.S.C. 154(b) by 0 days.

(21) Appl. No.: 14/324,825

(22) Filed: Jul. 7, 2014

(65) Prior Publication Data
US 2015/0108089 A1 Apr. 23, 2015

(30) Foreign Application Priority Data

Oct. 21, 2013 (KR) ........................ 10-2013-0125422

(51) Int. Cl.
*H01L 21/78* (2006.01)
*C03B 33/09* (2006.01)
*C03B 33/02* (2006.01)
*C03B 33/07* (2006.01)
*C03B 33/08* (2006.01)
*B23K 26/06* (2014.01)
*B23K 26/38* (2014.01)

(52) U.S. Cl.
CPC ............ *H01L 21/78* (2013.01); *B23K 26/0626* (2013.01); *B23K 26/38* (2013.01); *C03B 33/0222* (2013.01); *C03B 33/07* (2013.01); *C03B 33/082* (2013.01); *C03B 33/091* (2013.01)

(58) Field of Classification Search
None
See application file for complete search history.

(56) References Cited

U.S. PATENT DOCUMENTS

| RE43,605 E | 8/2012 | O'Brien et al. |
| 8,341,976 B2 | 1/2013 | Dejneka et al. |
| 8,444,906 B2 | 5/2013 | Lee et al. |
| 2009/0065481 A1* | 3/2009 | Kishimoto et al. ............. 216/87 |
| 2014/0175487 A1* | 6/2014 | Zhang ............................ 257/98 |

FOREIGN PATENT DOCUMENTS

| KR | 10-0621860 | 9/2006 |
| KR | 10-0631304 | 10/2006 |
| KR | 10-2007-0097189 | 10/2007 |
| KR | 10-2012-0119082 | 10/2012 |

* cited by examiner

*Primary Examiner* — Jiong-Ping Lu
(74) *Attorney, Agent, or Firm* — H.C. Park & Associates, PLC

(57) ABSTRACT

A method for cutting a substrate includes: radiating, as part of a first laser radiating process, a laser towards a surface of the substrate to form a first groove in a substrate. Radiating the laser towards the surface includes radiating, in sequence, the laser towards a first outer point (FOP), a second outer point (SOP), a first intermediate point (FIP), a second intermediate point (SIP), and a first cut point (FCP) of the surface, each of the points being spaced apart from one another by one or more distances. The FCP corresponds to a cut line of the substrate. The FOP and the SOP are respectively disposed at lateral sides of the FCP. The FIP is disposed between the FCP and the FOP. The SIP is disposed between the FCP and the SOP. The same kind and intensity of laser is radiated towards each of the points.

18 Claims, 8 Drawing Sheets

METHOD FOR CUTTING SUBSTRATE

CROSS-REFERENCE TO RELATED APPLICATION

This application claims priority from and the benefit of Korean Patent Application No. 10-2013-0125422, filed on Oct. 21, 2013, which is incorporated by reference for all purposes as if set forth herein.

BACKGROUND

1. Field

Exemplary embodiments relate to a method for cutting a substrate, and, more particularly, to a method for cutting a substrate using a laser.

2. Discussion

Many different types of flat panel displays are utilized, such as, for example, liquid crystal display (LCDs), organic light emitting diode (OLED) displays, plasma displays (PDs), field emission displays (FEDs), electrophoretic displays (EPDs), electrowetting displays (EWDs), and the like. A conventional flat panel display may include a display area to display an image and a pad area including a circuit to supply a driving signal to the display area. Further, a typical flat panel display may use a glass substrate as a base substrate, and, generally, the display area may include two substrates, whereas the pad area may include one substrate.

Typically, a substrate may have a quadrangular shape, such that a corner portion of a pad area of the substrate may have an edge that may be vulnerable to external impact. Damage to the substrate due to the external impact may be reduced by cutting the substrate corner portion of the pad area. Generally, when the substrate is cut, a laser may be utilized. It is noted that when a surface of the substrate is to be cut by radiating the laser onto the substrate, the laser may be intensively radiated onto a first portion of the substrate. In this manner, however, a second portion of the substrate may be affected by an increase in heat due to the laser radiation. As such, the second portion of the substrate may be damaged.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a method for cutting a substrate that may reduce the damage to the substrate, which may be caused, at least in part, by heat transfer associated with laser radiation utilized to cut the substrate.

Additional aspects will be set forth in the detailed description which follows, and, in part, will be apparent from the disclosure, or may be learned by practice of the inventive concept.

According to exemplary embodiments, a method for cutting a substrate includes: radiating, as part of a first laser radiating process, a laser towards a surface of the substrate to form a first groove in the substrate. Radiating the laser towards the surface includes radiating, in sequence, the laser towards a first outer point, a second outer point, a first intermediate point, a second intermediate point, and a first cut point of the surface. The first outer point, the second outer point, the first intermediate point, the second intermediate point, and the first cut point are spaced apart from one another by one or more distances. The first cut point corresponds to a cut line of the substrate. The first outer point and the second outer point are respectively disposed at a first lateral side and a second lateral side of the first cut point. The first intermediate point is disposed between the first cut point and the first outer point. The second intermediate point is disposed between the first cut point and the second outer point. The same kind of laser and the same intensity of laser is radiated towards each of the first outer point, the second outer point, the first intermediate point, the second intermediate point, and the first cut point.

According to exemplary embodiments, it may be possible to reduce the damage to a substrate, which may otherwise be caused, at least in part, by heat transfer associated with laser radiation utilized to cut the substrate. This may be achieved by radiating the laser to a cut line and a plurality of points one or more sides of the cut line rather than on one point of the cut line as part of cutting the substrate using the laser. It may also be possible to shorten a processing time by radiating the same kind of laser to the respective points to receive the laser radiation.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
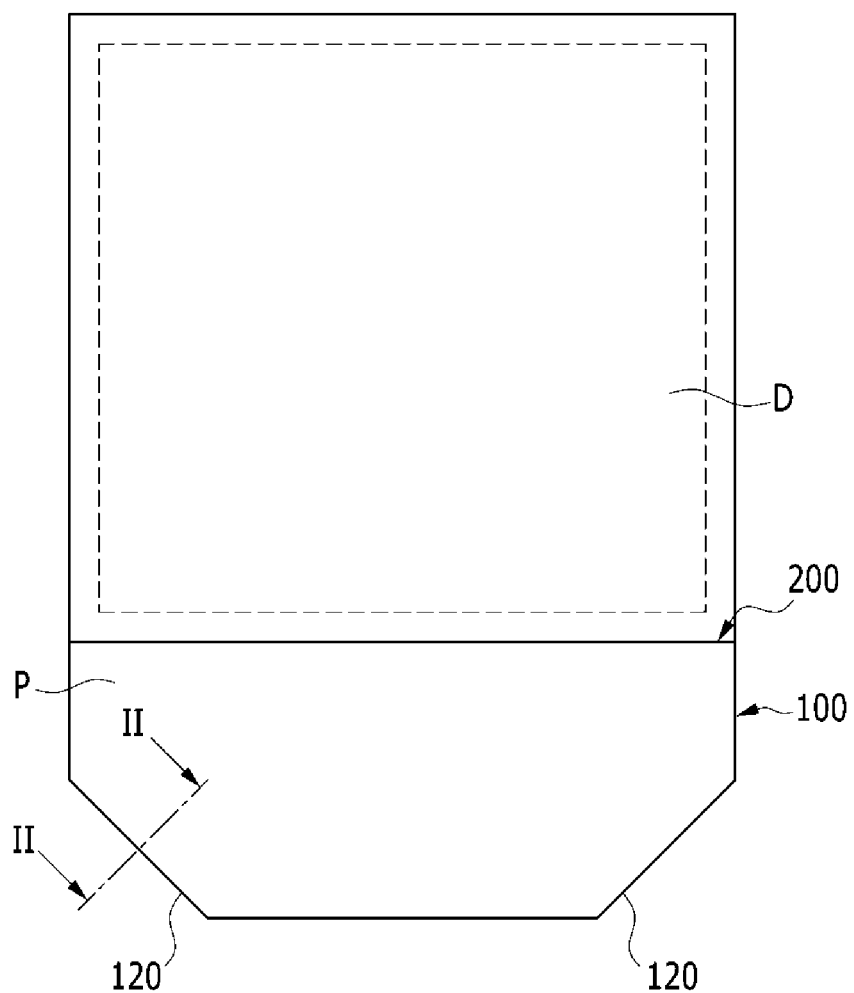
FIG. 1 is a diagram illustrating a display device, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
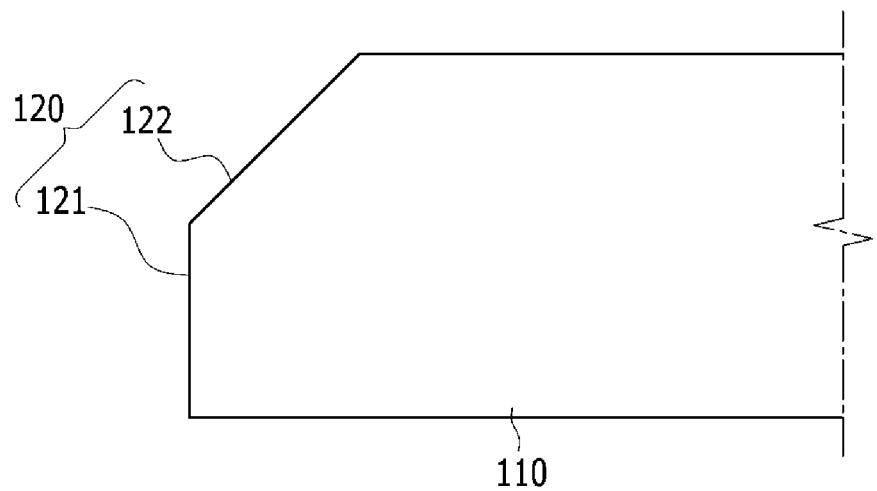
FIG. 2 is a cross-sectional view of the display device of FIG. 1 taken along sectional line II-II, according to exemplary embodiments.

FIG. 1 is a diagram illustrating a display device, according to exemplary embodiments. FIG. 2 is a cross-sectional view of the display device of FIG. 1 taken along sectional line II-II.

Referring to FIG. 1, a display device 1000 may include a first display panel 100 and a second display panel 200 which face each other. Although specific reference will be made to this particular implementation, it is also contemplated that display device 1000 may embody many forms and include multiple and/or alternative components. For example, it is contemplated that the components of display device 1000 may be combined, located in separate structures, and/or separate locations.

Although not illustrated, the first display panel 100 may include various thin film layers, such as a plurality of thin film transistors, data lines, gate lines, and pixel electrodes, each of which may be disposed on a substrate 110 made of any suitable material, such as, for example, transparent glass. The second display panel 200 may also include one or more thin film layers, such as, for instance, color filters (not shown) to enable the display of desired colors while light passes through the color filters and a common electrode (not illustrated), each of which may be disposed on a substrate made of any suitable material, such as, for example, transparent glass. In this manner, the display device 1000 may include a liquid crystal layer (not shown) disposed between the first display panel 100 and the second display panel 200.

In exemplary embodiments, the thin film layers of the first display panel 100 may include light emitting diodes, which may be disposed on the substrate 110. As such, the second display panel 200 may be an encapsulation substrate to protect the first display panel 100 including the light emitting diodes.

As seen in FIG. 1, the display device 1000 may include a display area D to display an image and a pad area P disposed outside the display area D.

The thin film transistors, the data lines, the gate lines, the pixel electrodes, the common electrode, the liquid crystal layer, and the like, may be disposed in the display area D to display the image according to a driving signal supplied from one or more components (not shown) disposed in the pad area P. Further, the thin film transistors, the data lines, the gate lines, the light emitting diodes, and the like, may be disposed in the display area D to display the image according to a driving signal supplied from one or more components (not illustrated) disposed in the pad area P. For instance, the one or more components may form a circuit portion to supply the driving signal to the display area D. The circuit portion may be disposed in the pad area P.

According to exemplary embodiments, the substrate 110 may include oblique portions 120 formed at corner portions (e.g., left and right corner portions) of the substrate 110 of the first display panel 100 in the pad area P. The oblique portions 120 may include a first (e.g., vertically linear) surface 121 extending from a lower surface of the substrate 110 towards an upper surface of the substrate 110 and a second (e.g., inclined) surface 122 extending towards the upper surface of the substrate 110 from the first surface 121. In this manner, the first surface 121 may extend in a first direction, whereas the second surface 122 may extend in a second direction crossing the first direction.

It is noted that a conventional substrate may include left and right corner portions of the substrate that may form an edge, such that the substrate may be damaged due to an external impact when, for instance, the substrate falls or collides with another object. For example, the substrate may be damaged when the corresponding display device is transferred between locations and one or more of the corner portions collide with another object. As such, the corresponding display device may also be damaged.

According to exemplary embodiments, however, the oblique portions 120 may be formed by cutting the edge portions of the left and right corner portions of the substrate 110 to reduce the potential for damage to the substrate 110, which may be otherwise caused as part of an external impact. This may, in turn, reduce the potential for damage to the display device 1000 including the substrate 110.

Figure 3:
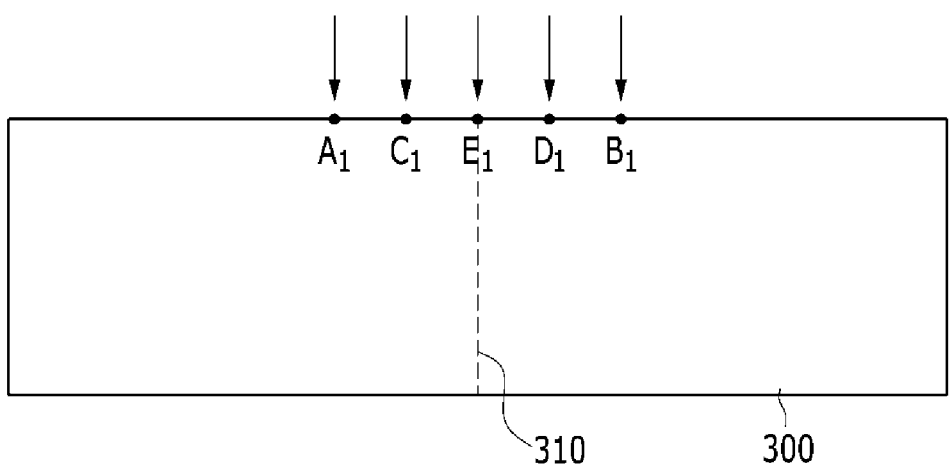
FIGS. 3, 4, and 5 are diagrams illustrating a method for cutting a substrate, according to exemplary embodiments.
Figure 4:
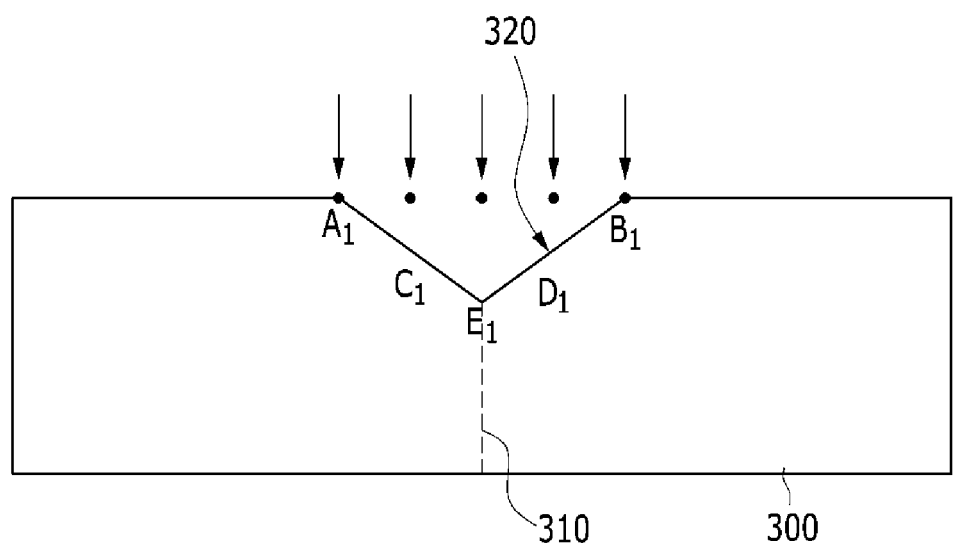
Figure 5:
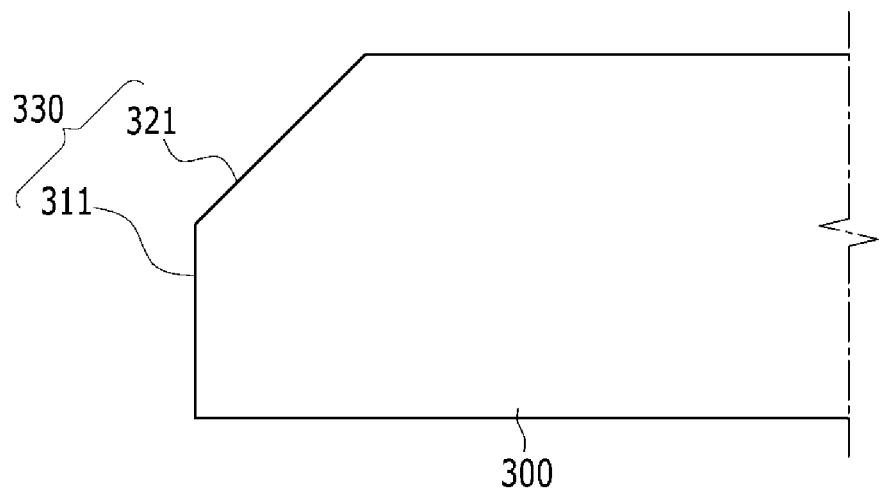

FIGS. 3 to 5 are diagrams illustrating a method for cutting a substrate, according to exemplary embodiments.

Referring to FIGS. 3 and 4, a first laser radiating process, to form a first groove 320 by radiating a laser to a first cut point E1, a first left outer point A1, a first right outer point B1, a first left middle point C1, and a first right middle point D1 of an upper surface of a substrate 300 made of, for example, glass may be performed. It is noted that the points C1 and D1 may be disposed at any suitable location between points A1 and E1 or E1 and B1, respectively. In other words, points C1 and D1 may not be "middle" points. To this end, although five radiation points are illustrated in FIGS. 3 and 4, it is contemplated that any suitable number of radiation points may be utilized.

As part of the first laser radiating process, a laser generated using a neodymium-doped yttrium aluminum garnet (Nd:YAG) lasing medium, a neodymium-doped yttrium lithium fluoride (Nd:YLF) lasing medium, a picosecond laser apparatus, and/or the like, may be used. It is noted that the laser may employ short pulse laser beams of pulse duration of 10 ps (picoseconds) or less.

The first cut point E1 corresponds to a cut line 310, and the first left outer point A1 and the first right outer point B1 are positioned at the left and right sides of the first cut point E1, respectively. The first left middle point C1 is positioned between the first cut point E1 and the first left outer point A1, and the first right middle point D1 is positioned between the first cut point E1 and the first right outer point B1. The first cut point E1, the first left outer point A1, the first right outer point B1, the first left middle point C1, and the first right middle point D1 are spaced apart from each other by determined distances, respectively. It is noted that the distances between the respective points A1, B1, C1, D1, and E1 may be the same as or different from each other. It is also contemplated that the respective distances may be variable. For example, the distance between A1 and C1 may be the same as the distance from B1 to D1, but may be different from the distance between C1 and E1, which may be the same as the distance between E1 and D1.

As part of the first laser radiating process, intensities and kinds of laser beams radiated onto the first cut point E1, the first left outer point A1, the first right outer point B1, the first left middle point C1, and the first right middle point D1 may be the same as each other. To this end, the duration of laser radiation (or amount of laser radiation) onto the first left outer point A1 and the first right outer point B1 may be the same as each other, and the duration of laser radiation (or amount of the laser radiation) onto the first left middle point C1 and the first right middle point D1 may be the same as each other. The duration or amount of the laser radiation onto the first cut point E1, the first left outer point A1, and the first left middle point C1 may be different from each other. It is also contemplated that, as part of the first laser radiating process, the laser may be radiated onto the first cut point E1, the first left outer point A1, the first right outer point B1, the first left middle point C1, and the first right middle point D1 several times. For example, a pulsating laser beam may be utilized to radiate relatively quick bursts of laser radiation onto the points A1 to E1 or a non-pulsating laser beam may be utilized, such that the various points A1 to E1 receive multiple instances of constant laser radiation. To this end, any suitable pattern of radiating the laser onto the various points A1 to E1 may be utilized.

According to exemplary embodiments, as part of the first laser radiating process, the laser may be radiated, with respect to a total number of radiation times, by 50% onto the first cut point E1, by 10% onto the first left outer point A1 and the first right outer point B1, respectively, and by 15% onto the first left middle point C1 and the first right middle point D1, respectively.

It is also contemplated that, in exemplary embodiments, the laser may be radiated onto the first left outer point A1, the first right outer point B1, the first left middle point C1, the first right middle point D1, and the first cut point E1 in sequence, as part of the first laser radiation process. In this manner, before the laser is radiated onto the first left outer point A1, the laser may be radiated onto the first right outer point B1, and before the laser is radiated onto the first left middle point C1, the laser may be radiated to the first right middle point D1. It is also contemplated that laser radiation onto the left points A1 and C1 may occur respectively before the laser radiation onto the right points B1 and D1. As such, deleterious effects associated with heat generated as part of the laser being radiated onto the substrate 300 may be reduced by radiating the laser onto several points rather than onto one point. To this end, the deleterious effects may also be removed (or otherwise mitigated) by radiating the laser according to a pattern of radiating events amongst the several points versus onto one point for a set duration.

As seen in FIGS. 3 and 4, one first left middle point C1 and one first right middle point D1 are positioned between the first cut point E1 and the first left outer point A1 and the first cut point E1 and the first right outer point B1, respectively. It is contemplated, however, that one or more points may be positioned between the first cut point E1 and the first left outer point A1 and the first cut point E1 and the first right outer point B1.

According to exemplary embodiments, the first groove 320 may be formed having a V-shaped cross-section from the upper surface of the substrate 300. A depth of the first groove 320 may be largest at a position corresponding to the first cut point E1. Further, the depth of the first groove 320 may decrease toward the first left outer point A1 and the first right outer point B1 from the first cut point E1. The cross-section of the first groove 320 may be symmetrical about the cut line 310. It is contemplated, however, that any suitable cross-sectional shape of the first groove 320 may be formed in accordance with exemplary embodiments described herein.

Referring to FIG. 5, a cut surface 330 may be formed by cutting the substrate 300 along the cut line 310 with the first groove 320 having the V-shaped cross-section using a cutting apparatus. The cut surface 330 includes a first surface (e.g., a vertically linear surface) 311 extending from a lower surface of the substrate 300 towards an upper surface of the substrate 300. Further, the cut surface 330 includes a second surface (e.g., an inclined surface) 321 extending towards an upper surface of the substrate 300 from the first surface 311. In this manner, the first surface 311 extends in a first direction and the second surface 321 extends in a second direction crossing the first direction.

According to exemplary embodiments, by radiating the laser onto the cut line 310 and the plurality of left and right points of the cut line 310 rather than onto one point of the cut line 310, it may be possible to prevent (or otherwise reduce) the damage to a substrate, which may otherwise be caused, at least in part, by heat transfer associated with laser radiation. Further, it may be possible to shorten a processing time by radiating the same kind of laser to the respective points A1, B1, C1, D1, and E1.

Figure 6:
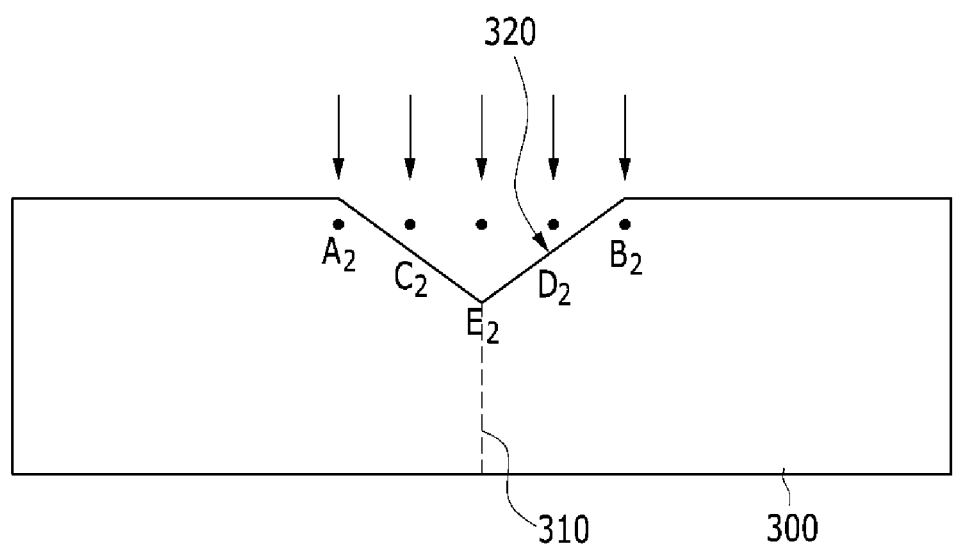
FIGS. 6, 7, and 8 are diagrams illustrating a method for cutting a substrate, according to exemplary embodiments.
Figure 7:
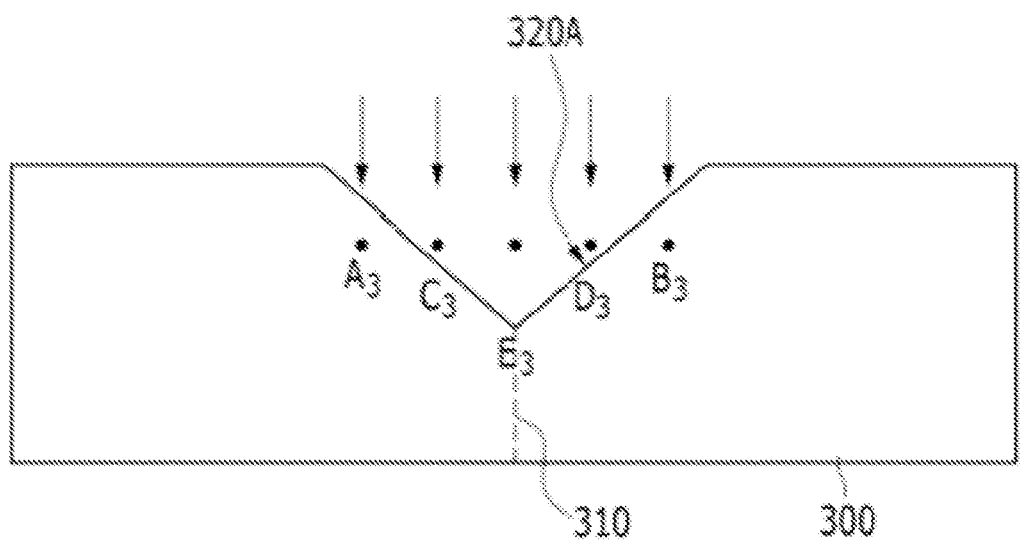
Figure 8:
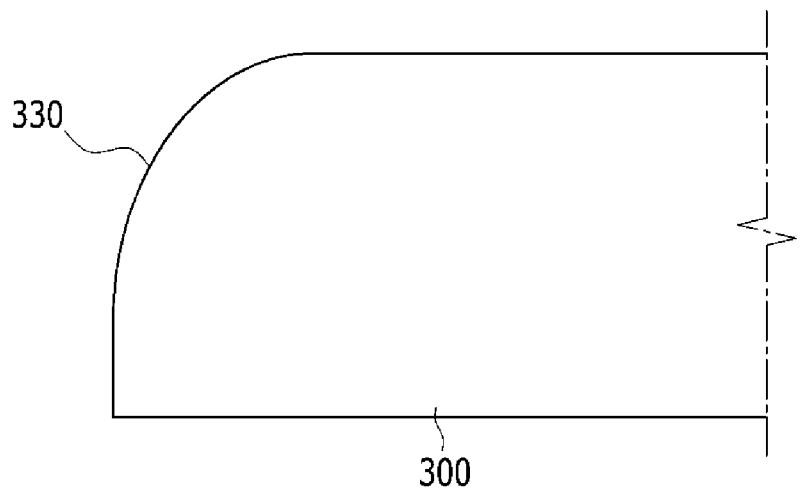

FIGS. 6 to 8 are diagrams illustrating a method for cutting a substrate, according to exemplary embodiments.

As described above, referring to FIG. 4, the first groove 320 having a V-shaped cross-section may be formed on the upper surface of the substrate 300 by performing the first laser radiating process. Subsequently, referring to FIGS. 6 to 8, a second laser radiating process may be performed to form a second groove 320A (see FIG. 7) by radiating a laser to a second cut point E2, a second left outer point A2, a second right outer point B2, a second left middle point C2, and a second right middle point D2 of the first groove 320. It is noted that the points C2 and D2 may be disposed at any suitable location between points A2 and E2 or E2 and B2, respectively. In other words, points C2 and D2 may not be "middle" points. To this end, although five radiation points are illustrated in FIG. 6, it is contemplated that any suitable number of radiation points may be utilized.

The cross-section of the second groove 320A may have a V-shape, and may be symmetrical about the cut line 310. A depth of the second groove 320A may be larger than the depth of the first groove 320. The depth of the second groove 320A may be largest at a position corresponding to the second cut point E2. In addition, the depth of the second groove 320A may decrease toward the second left outer point A2 and the second right outer point B2 from the second left middle point C2 and the second right middle point D2, respectively. It is contemplated, however, that any suitable cross-sectional shape of the second groove 320A may be formed in accordance with exemplary embodiments described herein.

The second cut point E2, the second left outer point A2, the second right outer point B2, the second left middle point C2, and the second right middle point D2 may be positioned vertically below the first cut point E1, the first left outer point A1, the first right outer point B1, the first left middle point C1, and the first right middle point D1, respectively.

According to exemplary embodiments, the second cut point E2, the second left outer point A2, the second right outer point B2, the second left middle point C2, and the second right middle point D2 may be spaced apart from each other by determined gaps, respectively. It is noted that the distances between the respective points A2, B2, C2, D2, and E2 may be the same as or different from each other. It is also contemplated that the respective distances may be variable. For example, the distance between A2 and C2 may be the same as the distance from B2 to D2, but may be different from the distance between C2 and E2, which may be the same as the distance between E2 and D2. The distances between the second cut point E2, the second left outer point A2, the second right outer point B2, the second left middle point C2, and the second right middle point D2 may be the same as the distances between the first cut point E1, the first left outer point A1, the first right outer point B1, the first left middle point C1, and the first right middle point D1. It is also contemplated that the distances may be different.

In exemplary embodiments, the kind of laser used in the second laser radiating process may be the same as the kind of laser used in the first laser radiating process. An intensity of the laser used in the second laser irradiating process may be larger than the intensity of the laser used in the first laser irradiating process.

As part of the second laser radiating process, the intensities and kinds of lasers radiated onto the second cut point E2, the second left outer point A2, the second right outer point B2, the second left middle point C2, and the second right middle point D2 may be the same as each other, or may be different form one or more of the other intensities and/or kinds of lasers. To this end, the duration (or amount of laser radiation) onto the second left outer point A2 and the second right outer point B2 may be the same as each other, and the duration (or amount of laser radiation) onto the second left middle point C2 and the second right middle point D2 may be the same as each other. The duration or amount of laser radiation onto the second cut point E2, the second left outer point A2, and the second left middle point C2 may be different from each other. It is also contemplated that, as part of the second laser radiating process, the laser may be radiated onto the second cut point E2, the second left outer point A2, the second right outer point B2, the second left middle point C2, and the second right middle point D2 several times. For example, a pulsating laser beam may be utilized to radiate relatively quick bursts of laser radiation onto the points A2 to E2 or a non-pulsating laser beam may be utilized, such that the various points A2 to E2 receive multiple instances of constant laser radiation. To this end, any suitable pattern of radiating the laser onto the various points A2 to E2 may be utilized.

As part of the second laser radiating process, the laser may be radiated onto the second left outer point A2, the second right outer point B2, the second left middle point C2, the second right middle point D2, and the second cut point E2 several times in sequence. In this manner, before the laser is radiated onto the second left outer point A2, the laser may be radiated onto the second right outer point B2, and before the laser is radiated onto the second left middle point C2, the laser may be radiated onto the second right middle point D2. It is also contemplated that laser radiation onto the left points A2 and C2 may occur respectively before the laser radiation onto the right points B2 and D2.

According to exemplary embodiments, as part of the second laser radiating process, the laser may be radiated, with respect to a total number of radiation times, by 50% onto the second cut point E2, by 10% onto the second left outer point A2 and the second right outer point B2, respectively, and by 15% onto the second left middle point C2 and the second right middle point D2, respectively.

In exemplary embodiments, deleterious effects associated with heat generated as part of the laser being radiated onto the substrate 300 may be reduced by radiating the laser onto several points rather than onto one point. To this end, the deleterious effects may also be removed (or otherwise mitigated) by radiating the laser according to a pattern of radiating events amongst the several points versus onto one point for a set duration.

Subsequently, a third laser radiating process, which cuts the substrate 300 by radiating a laser to a third cut point E3, a third left outer point A3, a third right outer point B3, a third left middle point C3, and a third right middle point D3 of the second groove 320A, is performed. It is noted that the points C3 and D3 may be disposed at any suitable location between points A3 and E3 or E3 and B3, respectively. In other words, points C3 and D3 may not be "middle" points. To this end, although five radiation points are illustrated in FIG. 7, it is contemplated that any suitable number of radiation points may be utilized.

The third cut point E3, the third left outer point A3, the third right outer point B3, the third left middle point C3, and the third right middle point D3 may be positioned vertically below the second cut point E2, the second left outer point A2, the second right outer point B2, the second left middle point C2, and the second right middle point D2, respectively.

According to exemplary embodiments, the third cut point E3, the third left outer point A3, the third right outer point B3, the third left middle point C3, and the third right middle point D3 may be spaced apart from each other by determined gaps, respectively. It is noted that the distances between the respective points A3, B3, C3, D3, and E3 may be the same as or different from each other. It is also contemplated that the respective distances may be variable. For example, the distance between A3 and C3 may be the same as the distance from B3 to D3, but may be different from the distance between C3 and E3, which may be the same as the distance between E3 and D3. The distances between the third cut point E3, the third left outer point A3, the third right outer point B3, the third left middle point C3, and the third right middle point D3 may be the same as the distances between the second cut point E2, the second left outer point A2, the second right outer point B2, the second left middle point C2, and the second right middle point D2. It is also contemplated that the distances may be different.

In exemplary embodiments, the kind of laser used in the third laser radiating process may be the same as the kind of laser used in the second laser radiating process. An intensity of the laser used in the third laser radiating process may be larger than the intensity of the laser used in the second laser radiating process.

As part of the third laser radiating process, intensities and kinds of the lasers radiated to the third cut point E3, the third left outer point A3, the third right outer point B3, the third left middle point C3, and the third right middle point D3 may be the same as each other, or may be different form one or more of the other intensities and/or kinds of lasers. To this end, the duration (or amount of laser radiation) onto the third left outer point A3 and the third right outer point B3 may be the same as each other, and the duration (or amount of laser radiation) onto the third left middle point C3 and the third right middle point D3 may be the same as each other. The duration or amount of laser radiation onto the third cut point E3, the third left outer point A3, and the third left middle point C3 may be different from each other. It is also contemplated that, as part of the third laser radiating process, the laser may be radiated onto the third cut point E3, the third left outer point A3, the third right outer point B3, the third left middle point C3, and the third right middle point D3 several times. For example, a pulsating laser beam may be utilized to radiate relatively quick bursts of laser radiation onto the points A3 to E3 or a non-pulsating laser beam may be utilized, such that the various points A3 to E3 receive multiple instances of constant laser radiation. To this end, any suitable pattern of radiating the laser onto the various points A3 to E3 may be utilized.

In exemplary embodiments, as part of the third laser radiating process, the respective lasers may be radiated onto the third left outer point A3, the third right outer point B3, the third left middle point C3, the third right middle point D3, and the third cut point E3 several times in sequence. In this manner, before the laser is radiated onto the third left outer point A3, the laser may be radiated onto the third right outer point B3, and before the laser is radiated onto the third left middle point C3, the laser may be radiated onto the third right middle point D3. It is also contemplated that laser radiation onto the left points A3 and C3 may occur respectively before the laser radiation onto the right points B3 and D3.

According to exemplary embodiments, as part of the third laser radiating process, the laser may be radiated, with respect to a total number of radiation times, by 50% onto the third cut point E3, by 10% onto the third left outer point A3 and the third right outer point B3, respectively, and by 15% onto the third left middle point C3 and the third right middle point D3, respectively.

In exemplary embodiments, the substrate 300 may be cut to form the cut surface 330 by performing the first, second, and third laser radiating processes. It is also contemplated that the cut surface 330 of the substrate 300 may be a curved (or otherwise arcuate) surface connected from the lower surface to the upper surface of the substrate 300 and the upper surface of the substrate 300, such as illustrated in FIG. 8.

According to exemplary embodiments, a laser having larger intensity than the laser used in the first laser radiating process may be used in the second laser radiating process, and a laser having larger intensity than the laser used in the second laser radiating process may be used in the third laser radiating process. As such, since a high-output laser is not used in an initial cutting stage, that is, in the first laser radiating process, it may be possible to prevent (or otherwise reduce the potential of) the surface of the substrate 300 from being broken.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method for cutting a substrate, comprising:
radiating, as part of a first laser radiating process, a laser towards a surface of the substrate to form a first groove in the surface,
radiating a laser towards the surface of the first groove to form a second groove as part of a second laser radiating process,
wherein:
radiating the laser towards the surface to form the first groove comprises radiating, in sequence, the laser towards a first outer point, a second outer point, a first intermediate point, a second intermediate point, and a first cut point of the surface,
the first outer point, the second outer point, the first intermediate point, the second intermediate point, and the first cut point are spaced apart from one another by one or more distances,
the first cut point corresponds to a cut line of the substrate,
the first outer point and the second outer point are respectively disposed at a first lateral side and a second lateral side of the first cut point,
the first intermediate point is disposed between the first cut point and the first outer point,
the second intermediate point is disposed between the first cut point and the second outer point,
the same kind of laser and the same intensity of laser is radiated towards each of the first outer point, the second outer point, the first intermediate point, the second intermediate point, and the first cut point, and
radiating the laser towards the surface of the first groove comprises radiating the laser towards a second cut point, a third outer point, a fourth outer point, a third intermediate point, and a fourth intermediate point of the first groove.

2. The method for cutting a substrate of claim 1, wherein, with respect to a total number of radiation times of the laser toward the substrate, the laser is radiated 50% of the radiation times toward the first cut point, 15% of the radiation times toward the first intermediate point, 15% of the radiation times toward the second intermediate point, 10% of the radiation times toward the first outer point, and 10% of the radiation times toward the second outer point.

3. The method for cutting a substrate of claim 2, wherein:
the first groove has a V-shaped cross-section, and
the cross-section of the first groove is symmetrical about the cut line.

4. The method for cutting a substrate of claim 3, wherein:
a depth of the first groove is greatest at a portion corresponding to the first cut point, and
the depth of the first groove decreases toward each of the first outer point and the second outer point.

5. The method for cutting a substrate of claim 4, wherein the second cut point, the third outer point, the fourth outer point, the third intermediate point, and the fourth intermediate point are disposed below the first cut point, the first outer point, the second outer point, the first intermediate point, and the second intermediate point, respectively.

6. The method for cutting a substrate of claim 5, wherein the kind of laser utilized as part of the first laser radiating process is the same as the kind of laser utilized as part of the second laser radiating process.

7. The method for cutting a substrate of claim 6, wherein the intensity of the laser radiated as part of the second laser radiating process is greater than the intensity of the laser radiated as part of the first laser radiating process.

8. The method for cutting a substrate of claim 7, wherein:
the second laser radiating process comprises radiating, in sequence, the laser towards the third outer point, the fourth outer point, the third intermediate point, the fourth intermediate point, and the second cut point, and
the kind of laser and the intensity of the laser radiated towards the third outer point, the fourth outer point, the third intermediate point, the fourth intermediate point, and the second cut point are the same as one another.

9. The method for cutting a substrate of claim 8, wherein, with respect to a total number of radiation times of the laser toward the first groove, the laser is radiated 50% of the radiation times toward the second cut point, 15% of the radiation times toward the third intermediate point, 15% of the radiation times toward the fourth intermediate point, 10% of the radiation times towards the third outer point, and 10% of the radiation times towards the fourth outer point.

10. The method for cutting a substrate of claim 9, wherein:
the second groove has a V-shaped cross-section, and
the cross-section of the second groove is symmetrical about the cut line.

11. The method for cutting a substrate of claim 10, wherein:

a depth of the second groove is greater than the depth of the first groove,
the depth of the second groove is greatest at a portion corresponding to the second cut point, and
the depth of the second groove decreases toward each of the third outer point and the fourth outer point.

12. The method for cutting a substrate of claim 11, further comprising:
radiating, after the second laser radiating process, a laser towards the surface of the second groove to cut the substrate as part of a third laser radiating process,
wherein radiating the laser towards the second groove comprises radiating the laser towards a third cut point, a fifth outer point, a sixth outer point, a fifth intermediate point, and a sixth intermediate point of the second groove.

13. The method for cutting a substrate of claim 12, wherein the third cut point, the fifth outer point, the sixth outer point, the fifth intermediate point, and the sixth intermediate point are vertically disposed below the second cut point, the third outer point, the fourth outer point, the third intermediate point, and the fourth intermediate point, respectively.

14. The method for cutting a substrate of claim 13, wherein the kind of laser utilized as part of the third laser radiating process is the same as the kind of laser utilized as part of the second laser radiating process.

15. The method for cutting a substrate of claim 14, wherein the intensity of the laser radiated as part of the third laser radiating process is greater than the intensity of the laser radiated as part of the second laser radiating process.

16. The method for cutting a substrate of claim 15, wherein:
the third laser radiating process comprises radiating, in sequence, the laser towards the fifth outer point, the sixth outer point, the fifth intermediate point, the sixth intermediate point, and the third cut point, and
the kind of laser and the intensity of the laser radiated towards the fifth outer point, the sixth outer point, the fifth intermediate point, the sixth intermediate point, and the third cut point are the same as one another.

17. The method for cutting a substrate of claim 16, wherein, with respect to a total number of radiation times of the laser toward the second groove, the laser is radiated 50% of the radiation times towards the third cut point, 15% of the radiation times toward the fifth intermediate point, 15% of the radiation times towards the sixth intermediate point, 10% of the radiation times towards the fifth outer point, and 10% of the radiation times towards the sixth outer point, respectively.

18. The method for cutting a substrate of claim 1, wherein the cut surface of the substrate comprises:
a first surface extending in a first direction from a lower surface of the substrate towards the surface of the substrate, the surface being an upper surface; and
a second surface extending in a second direction from the first surface towards the upper surface of the substrate, the second direction crossing the first direction.

* * * * *